(12) United States Patent
Hiebel et al.

(10) Patent No.: US 8,612,177 B2
(45) Date of Patent: Dec. 17, 2013

(54) METHOD FOR PRESENTING MEASURED RESULTS FROM A NETWORK ANALYSER WITH A SIMULTANEOUS TOLERANCE DISPLAY

(75) Inventors: Michael Hiebel, Fuerstenfeldbruck (DE); Ute Phillip, Munich (DE)

(73) Assignee: Rohde and Schwarz GmbH & Co. KG, Munich (DE)

( * ) Notice: Subject to any disclaimer, the term of this patent is extended or adjusted under 35 U.S.C. 154(b) by 902 days.

(21) Appl. No.: 12/280,298

(22) PCT Filed: Feb. 8, 2007

(86) PCT No.: PCT/EP2007/001078
§ 371 (c)(1),
(2), (4) Date: Apr. 29, 2010

(87) PCT Pub. No.: WO2007/096059
PCT Pub. Date: Aug. 30, 2007

(65) Prior Publication Data
US 2010/0204956 A1   Aug. 12, 2010

(30) Foreign Application Priority Data
Feb. 21, 2006   (DE) .......................... 10 2006 008 063

(51) Int. Cl.
*G06F 17/18*   (2006.01)
*G01R 27/04*   (2006.01)

(52) U.S. Cl.
USPC .......................................... 702/179; 324/638

(58) Field of Classification Search
USPC ......... 702/179, 57–60, 64–76, 79, 81, 84–86, 702/89–90, 106, 108, 117, 120, 123–127, 702/182–183, 185, 189–190, 199; 324/600–602, 605, 612, 616–617, 620, 324/622, 628, 637–638, 650; 345/12–16
See application file for complete search history.

(56) References Cited

FOREIGN PATENT DOCUMENTS

| EP | 0 768 537 A1 | 4/1997 |
|---|---|---|
| GB | 2 155 189 A | 9/1985 |
| WO | WO 03/076956 A2 | 9/2003 |

OTHER PUBLICATIONS

Park et al., Uncertainty Estimation of Measurement Using a Vector Network Analyzer, 2002 IEEE, Proceedings of IEEE TENCON'02, pp. 1093-1096.*

Thilo Bednorz, Measurement Uncertainties for Vector Network Analysis, Oct. 21, 1996, 9 pages.*

(Continued)

*Primary Examiner* — Toan Le
(74) *Attorney, Agent, or Firm* — Dittavong Mori & Steiner, P.C.

(57) ABSTRACT

A method for determining measurement uncertainty of measured values of a network analyzer. For every measured value of a respectively-selected measurement type, the measurement uncertainty is calculated in an internal computer of the network analyzer according to modulus and/or phase and displayed together with the respective measured value. Data required for this computation, which result directly from properties and an operating mode of the network analyzer, are stored in databanks allocated to the internal computer and are therefore directly accessible to the internal computer, and only data from additionally-used measurement resources, which differ from the data already stored in the databanks, are entered externally into the databanks, where they are set off against the originally-stored data and included as new data in the calculation of the measurement uncertainty.

19 Claims, 6 Drawing Sheets

(56) References Cited

OTHER PUBLICATIONS

Morgan et al., Generalized Adaptive Calibration Schemes for Precision RF Vector Network Analyzer Measurements, Aug. 2003, IEEE Transactions on Instrumentation and Measurement, vol. 52, No. 4, pp. 1266-1272.*

Markus Zeier; "Software Automates The Calculation of Measurement Uncertainty"; XP002437380; metINFO, vol. 12, No, Feb. 2005 pp. 20-23 (English translation included).

Anritsu;Application Note; "What is Your Measurement Accuracy?"; Vector Nework Analyzer; XP002437385; REV: A; Sep. 2001 pp. 1-7.

Jeurg Reufenacht and Markus Zeier; Euromet.EM.RF-S16 Final Report "Comparison of scattering parameter measurements in the coaxial 2.4 mm line system"; Supplementary comparison in Electricity and Magnetism, Radio frequencies (European Metrology Collaboration Project No. 555) XP002437386; Nov. 2004; pp. 1-53 and 110-115.

EA Committee 2 (Technical Activities); "EA Guidelines on the Evaluation of Vector Network Analysers (VNA)"; XP001162754; May 2000 pp. 1-23.

Ken Wong; "Uncertainty Analysis of the Weighted Least Squares VNA Calibration"; $64^{th}$; ARFTG Conference 2005 IEEE; pp. 23-31.

International Search Report of Application No. PCT/EP2007/001078, mailed Jun. 22, 2007.

International Preliminary Report on Patentability, PCT/EP2007/001078, Nov. 6, 2008, pp. 1-15.

* cited by examiner

METHOD FOR PRESENTING MEASURED RESULTS FROM A NETWORK ANALYSER WITH A SIMULTANEOUS TOLERANCE DISPLAY

CROSS-REFERENCE TO RELATED APPLICATION

The present application is a national stage application of PCT/EP2007/001078 filed on Feb. 8, 2007, and claims priority to German Application No. 10 2006 008 063.7, filed on Feb. 21, 2006, the entire contents of which are herein incorporated by reference.

BACKGROUND OF THE INVENTION

1. Field of the Invention

The invention relates to a method for determining the measurement uncertainty of measured values of a network analyser.

2. Discussion of the Background

Vectorial network analysers are highly-complicated measuring systems. Computation of the measurement uncertainty of the measured values is correspondingly complex. Intensive investigations have already been carried out in this field, and the topic already forms the subject matter of current research activities published, for example, in European Co-operation for Accreditation: Guidelines on the Evaluation of Vector Network Analysers (VNA), Publication Reference EA-10/12, May 2000; Rytting, Douglas Kent: "Improved RF Hardware and Calibration Methods for Network Analysers", Hewlett Packard, Network Measurement Divisions, Santa Rosa Calif., 1991; Bachmaier, Ulrich; Hand and Stumper: "Current Problems in the Presentation of RF Measured Values", Presentations of the $139^{th}$ PTB Seminar on May 13, 1998, PTB-E58, Braunschweig, June 1998; Zeiler, Markus: "Software automates the calculation of measurement uncertainty", metINFO, Vol. 12, No. 2/2005; Vidkjaer, Jens: "Network Analyser Uncertainty Computations for Small-Signal Model Extractions", Technical University of Denmark, Electromagnetic Institute, Lyngby, Denmark, R549, February 1994.

One disadvantage of these known methods is that many influencing parameters, which must either be entered into the internal computer of the network analyser by the user of the network analyser in order to implement the measurement or evaluated in corresponding formulae using an external computer, contribute to the measurement uncertainty. In fact, corresponding measurement-uncertainty curves presented separately according to modulus and phase for the respectively-selected measured value, for example, the reflection factor, have already been provided for the user in the data sheet of the network analyser, as shown in FIG. 1. However, even for an experienced test engineer, it is difficult to determine and to present the associated measurement uncertainty for the relevant test result from this information. The user must select the correct measurement uncertainty curve dependent upon the measurement frequency and the respective measured value. In this context, the scales used for the display, which are typically linear scales, do not always correspond to the scaling (for example, dB-scale) required by the user for the measured result. Converting a symmetrical, linear tolerance value to an asymmetric dB-tolerance value with different upper and lower thresholds is also generally difficult. Such methods are therefore very complicated and demanding on the user. A further difficulty is that the tolerance curves for amplitude and phase are given separately, so that, in the case of a complex display, the modulus and phase values must be set off against one another in order to determine the tolerance region associated with a given measured value, as presented in FIG. 2 for a conventional, complex, graphic display.

Although vectorial network analysers are used primarily for the measurement of scattering parameters S, they can also be used for measuring Z-, Y-, H-(hybrid) parameters, group delay time, VSWR or for determining wave parameters a and b. The measurement inaccuracies (tolerances) occurring in the wave-parameter measurement are naturally larger, because there is no possibility for a preceding system-error correction by calibration in this context. With regard to wave-parameter measurements of this kind, which are preferable with nonlinear devices under test, a level calibration with an additional power meter is required and, the conventional measurement-uncertainty data previously provided by the manufacturer in the data sheet cannot therefore be used to calculate the tolerances.

SUMMARY OF THE INVENTION

The object of the invention is therefore to provide a method, which allows the user of a vectorial network analyser to determine the respective measurement uncertainty of the measured values for the various measurement parameters in a simple and straightforward manner without unnecessary entries by the user and to display these directly together with the measured value.

This object is achieved, for example, by a method for determining measurement uncertainty of measured values of a network analyser, where for every measured value of a respectively-selected measurement type, the measurement uncertainty is calculated in an internal computer of the network analyser according to modulus and/or phase and displayed together with the respective measured value. Data required for this computation, which result directly from properties and an operating mode of the network analyser, are stored in databanks allocated to the internal computer and are therefore directly accessible to the internal computer, and only data from additionally-used measurement resources, which differ from the data already stored in the databanks, are entered externally into the databanks, where they are set off against the originally-stored data and included as new data in the calculation of the measurement uncertainty.

According to the invention, the measured-value tolerance is calculated for every individual measured value directly in the internal computer of the network analyser using known algorithms for the computation of measurement uncertainty. In this context, both the measured value and also the data necessary for the computation of the measurement uncertainty, which are required dependent upon the measurement parameter (S-, Z-, Y-, H-parameters, group delay time, VSWR, wave parameters and similar), have already been stored by the manufacturer in the test laboratory in corresponding databanks allocated to the internal computer of the network analyser, so that the measurement uncertainty can be calculated for the respective measured value completely independently, without user interaction, using the computation software running on the internal computer of the network analyser. For example, the data regarding the respective type of the network analyser and its options are stored in these databanks by the manufacturer in the test laboratory; moreover, the data for the respective, selectable device settings, such as measurement frequency, measurement bandwidth, average factor (factor for average forming), output level of the high-frequency generator, characteristic data including error tolerances of the calibration standards used by the manufacturer, test cables and test plug-and-socket connections, characteristic data of the verification standards, including their tolerances, with which the calibration of the network analyser is monitored in the manufacturer's test laboratory. Furthermore, the so-called effective system data determined from the latter by the manufacturer in the test laboratory, as they have generally been documented in the manufacturer's data sheets for the presentation of the S-parameters, are also stored in the memory.

From these data already entered by the manufacturer in the network analyser, the measurement uncertainty for every individual measured value can then be calculated according to known algorithms using the corresponding computation software in the internal computer of the network analyser, and is then allocated directly to the measurement curve resulting from the individual measured values and presented together with these, for example, graphically on a screen, in the form of a tolerance zone. Accordingly, the user is no longer required to implement the troublesome interpretation of a measurement-uncertainty curve (FIG. 1), which is accessible only via the data sheet.

Only if, for example, a calibration kit or test cables or test plug-and-socket connections, which differ from those originally used by the manufacturer, are provided by the user for the current measurement, must the user additionally enter these data, which differ from the data originally stored in the databanks, into the network analyser. This can be implemented in a simple manner, for example, via a data medium, which is provided with the respective measurement resources (calibration kit, test cable, test plug-and-socket connection etc.), and from which the data can be entered into a databank, so that they are accessible to the computation software of the internal computer.

Alternatively, a user dialogue for the input of divergent measurement-resource data of this kind is also conceivable, wherein the data for all of the most-current measurement resources such as standard calibration kits, test cables, test plug-and-socket connections etc., which can be used together with the network analyser, are listed in a corresponding databank of the network analyser. These then only need to be selected by the user and are therefore directly accessible to the computation software. Such data entered additionally by the user of the network analyser relating to different measurement resources are then set off against the data for the measurement resources originally used by the manufacturer to provide new data, which are then used by the internal computer for the actual determination of the measurement uncertainty according to the known algorithms.

This type of computation and presentation of the measurement uncertainty directly together with the measured curves is particularly appropriate for the presentation of scattering parameters, but can also be used in a similar manner for the measurement and presentation of other measurement parameters of linear or nonlinear devices under test. It is only a matter of making the data necessary for these other measurement parameters, which are required for the calculation of the corresponding measurement uncertainty according to the known algorithms, accessible via databanks to the internal computer of the network analyser.

In this manner, the measurement-uncertainty values for transmission measurements, for the measurement of impedances, group delay time or VSWR and also for wave-parameter measurements can be calculated and displayed together with the measured values. In the case of wave-parameter measurements, a level calibration by means of an external power meter is required. In this context, the power meter is connected to the network analyser in addition to the HF connection via a data connection, so that the technical data of the power meter can also be transmitted in a simple manner to the network analyser, where they can be used as described for the computation of the measurement uncertainty on the internal computer.

BRIEF DESCRIPTION OF THE DRAWINGS

The invention is described in greater detail below with reference to the drawings on the basis of exemplary embodiments. The drawings are as follows.

DETAILED DESCRIPTION OF EXEMPLARY EMBODIMENTS OF THE INVENTION

Figure 1:
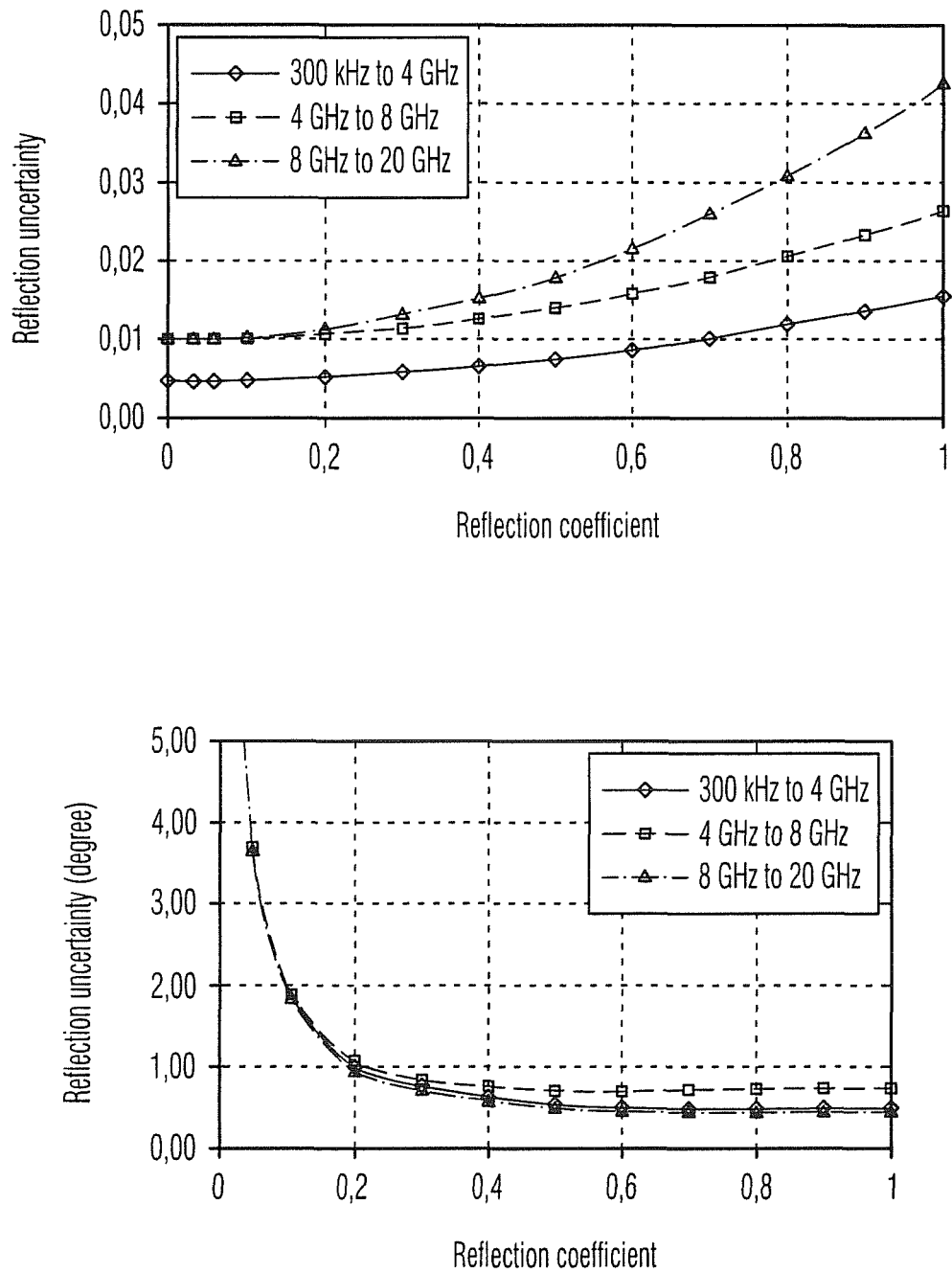
FIG. 1 shows measurement-uncertainty curves for the reflection factor $S_{11}$ according to modulus and phase for various frequencies.
Figure 2:
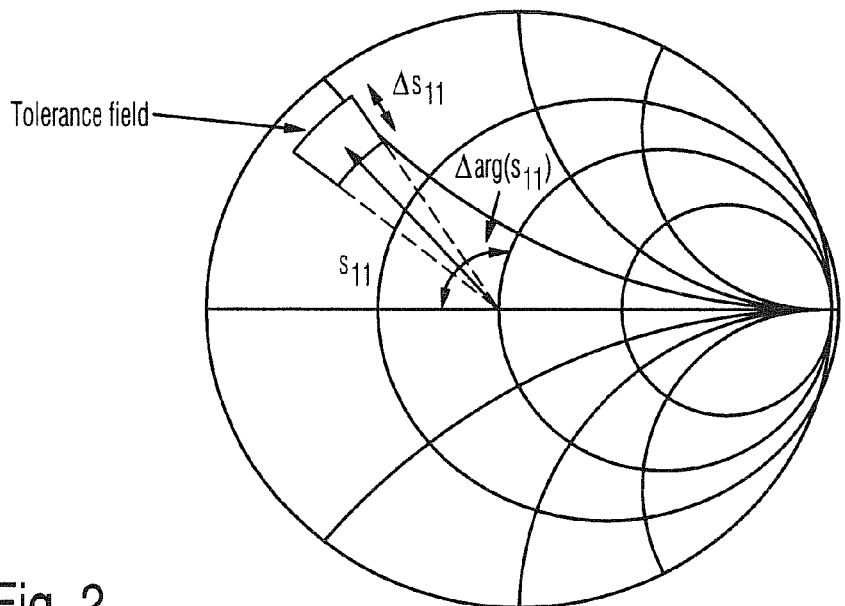
FIG. 2 shows a presentation of the measurement uncertainty in the case of a complex East curve (reflection factor $S_{11}$ in the Smith diagram)
Figure 3:
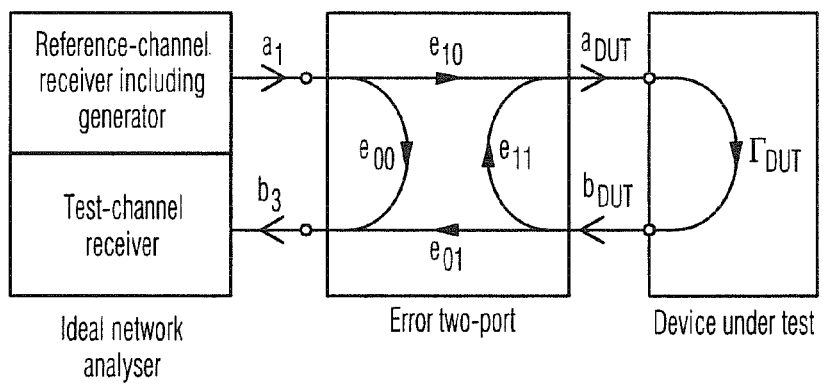
FIG. 3 shows a system-error model in the case of the OSM calibration.

In the first section of the following description, the measurement-uncertainty computation for linear devices under test will be described with reference to FIGS. 3 to 7 using the example of the modulus of the scattering parameter $S_{11}$. The description will also indicate how the effective system data can be determined directly by user verification.

The second section describes the determination of measurement-uncertainty for nonlinear devices under test.

Section 1:

Tolerance analysis for linear measurements using the example of the modulus of the S-parameter $S_{11}$ A vectorial network analyser contains a high-frequency generator for generating the stimulus signal. A directive element is provided at each test port in order to separate the incident wave a from the reflected wave b. The test signals (typically 4 signals in the case of a two-port network analyser) are processed coherently (phase-synchronously) by corresponding receivers. The complex S-parameters of the device under test are calculated from the complex wave parameters registered as a result, for example, via the frequency.

A system-error correction is generally used because of numerous non-idealities of the measuring device and with the contact with the device under test. This compensates systematic deviations. A vectorial registration of the measurement parameter is a prerequisite for this process. Alongside these systematic deviations, statistical inaccuracies also occur in every measurement, for example, as a result of receiver noise or temperature drift.

The system-error correction is based upon calibration. In this procedure, several calibration standards with (partially)

known properties are measured with the network analyser to be calibrated. The choice of standards is specified by the calibration method used. To avoid rendering the following explanation unnecessarily complicated, a one-port measurement will be assumed by way of simplification. Accordingly, any other test ports, which may be provided on the network analyser, are not involved in the measurement. The reflection factor to be determined is given by the relationship:

$$\Gamma_{DUT} = \frac{b_{DUT}}{a_{DUT}} \quad (1\text{-}1)$$

For example, the calibration standards open (O), short (S) and match (M) are used for the OSM-method. Deviations in technical data can be documented in a traceable manner with these standards. These data are generally communicated to the network analyser in the form of so-called characteristic data via a data medium. The analyser calculates the correction terms $e_{00}, e_{01}, e_{11} \ldots$ of the corresponding error model (FIG. 3) from the characteristic data of the calibration standards and the measurement result of the calibration. The characteristic data also provide a given uncertainty with regard to their traceability. This must be taken into consideration in the statistical tolerance analysis, to which reference will be made below.

From the signal-flow graphs of the error model, the measured value $M=b_3/a_1$ is calculated as a function of the error terms $e_{00}, e_{01}, e_{10}, e_{11} \ldots$ and the reflection factor $\Gamma_{DUT}=b_{DUT}/a_{DUT}$ of the device under test.

$$M = \frac{b_3}{a_1} = e_{00} + \frac{e_{01}e_{10}\Gamma_{DUT}}{1 - e_{11}\Gamma_{DUT}} \quad (1\text{-}2)$$

The measured value M recorded by the ideal network analyser by means of the wave parameters $a_1$ and $b_3$ is described by the above formula. The parameter $e_{01}$ will never provide the value 0 in a functional network analyser. It can therefore be assumed that the model parameter $e_{01}$ is $e_{01}=1$, and to include its influence in the parameter $e_{10}$.

$$M = e_{00} + \frac{e_{10}\Gamma_{DUT}}{1 - e_{11}\Gamma_{DUT}} \quad (1\text{-}3)$$

If the measurement is performed with the standards open ($\Gamma_{DUT}=\Gamma_O$), short ($\Gamma_{DUT}=\Gamma_S$) and match ($\Gamma_{DUT}=\Gamma_M$), the measured value $M=M_O$, $M=M_S$ or $M=M_M$ is obtained. If these measured values are combined with the characteristic data $\Gamma_O, \Gamma_S$ and $\Gamma_M$ in the formula (1-3), the following equation system is obtained. By way of simplification $\Gamma_M=0$ has been assumed. This is acceptable in many practical applications.

$$M_O = e_{00} + \frac{e_{10}\Gamma_O}{1 - e_{11}\Gamma_O} \quad (1\text{-}4)$$

$$M_S = e_{00} + \frac{e_{10}\Gamma_S}{1 - e_{11}\Gamma_S} \quad (1\text{-}5)$$

$$M_M = e_{00} \quad (1\text{-}6)$$

By resolving the equation system, the error terms $e_{00}, e_{10}$ and $e_{11} \ldots$ can be calculated from the values $M_O, M_S, M_M, \Gamma_O, \Gamma_S$ and $\Gamma_M$.

$$e_{00} = M_M \quad (1\text{-}7)$$

$$e_{10} = \frac{(M_O - M_S)(1 - e_{11}\Gamma_O)(1 - e_{11}\Gamma_S)}{\Gamma_O(1 - e_{11}\Gamma_S) - \Gamma_S(1 - e_{11}\Gamma_O)} \quad (1\text{-}8)$$

$$e_{11} = \frac{M_S - e_{00} - e_{10}\Gamma_S}{(M_S - e_{00})\Gamma_S} \quad (1\text{-}9)$$

The error terms $e_{00}, e_{10}, e_{11}$ can also be understood as raw system data of the one-port measurement.

TABLE 2

Interpretation of the error terms of the 3-term method

| Raw system data | Error term |
| --- | --- |
| Uncorrected reflection synchronism | $e_{10}$ |
| Uncorrected directivity | $e_{00}$ |
| Uncorrected test port matching | $e_{11}$ |

The error terms $e_{00}, e_{10}, e_{11}$ determined in this manner are now used in order to implement a system-error correction. For this purpose, formula (1-3) is resolved according to $\Gamma_{DUT}$, and the complex error terms are inserted together with the complex measured value $M_{DUT}$. The system-error corrected measured value $\Gamma_{DUT}$ is obtained.

$$\Gamma_{DUT} = \frac{M_{DUT} - e_{00}}{e_{10} + e_{11}(M_{DUT} - e_{00})} \quad (1\text{-}10)$$

Figure 4:
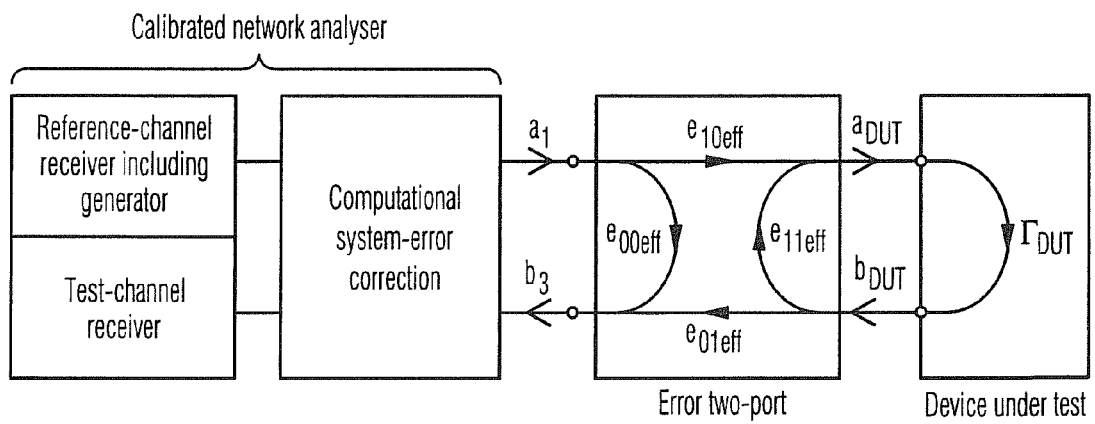
FIG. 4 shows a system-error model of the one-port-calibrated network analyser (OSM calibration)

Systematic measurement uncertainties are therefore corrected. However, the statistical measurement uncertainties are superposed on these. This means that the error terms $e_{00}, e_{10}, e_{11}$ contain a residual error. In particular, the statistical inaccuracy, with which the calibration standards are known in a traceable manner, must be emphasised in this context. The measurement inaccuracies given by the measuring device contribute to the fact that the measurement, for example, of the open standard, is not exactly reproducible, and therefore, for example, the measured value $M_o$ is contaminated with an uncertainty. It is therefore conventional to describe the uncertainties remaining after the calibration via the effective system data (FIG. 4). These are determined empirically by corresponding verification methods. Manufacturers indicate the effective system data as worst-case values, for example, in the data sheet.

TABLE 3

Example of effective system data

| Model parameter in calibrated VNA | Symbol | Sample value in dB |
|---|---|---|
| effective directivity | $e_{00eff}$ | >46 dB |
| effective source port matching | $e_{11eff}$ | >40 dB |
| effective reflection synchronism | $e_{10eff}$ | <0.04 dB |
| effective load port matching | $e_{22eff}$ | >46 dB |
| effective transmission synchronism | $e_{10eff}e_{32eff}$ | <0.06 dB |

The effective system data indicated in the data sheet are distinguished according to device type (device family, frequency range) and according to hardware optioning of the devices. A given device setting and a given calibration kit, which is offered as an accessory by the manufacturer, is assumed by way of example. For the user, these two conditions in particular often represent an arbitrary restriction.

TABLE 4

Influencing parameters for the effective system data

| | Example or set values in a data sheet | Alternative for user |
|---|---|---|
| Hardware configuration: | | |
| Type or network analyser | ZVB8 | Distinction generally possible for the user on the basis of the datasheet |
| Relevant hardware options | Calibration lines Direct generator and receiver access | Distinction generally possible for the user on the basis of the datasheet |
| Test cables used | ZV-Z11 | Other high-quality test cables from the accessory range |
| Device setting: | | |
| 1F-bandwidth: | 10 Hz | Any other bandwidth available on the device (e.g. 100 kHz) |
| Average factor: | 1 | Any other average factor available on the device e.g. 100 |
| Test port output level: | −10 dBm | Any other level adjustable on the device |
| Calibration method: | TOM | Any other calibration method supported by the device (e.g. full 1 and 2 port calibrations) |
| Calibration kit: | R&S ® ZV-Z21 | Another calibration kit e.g. R&S ® ZV-Z32 or from another manufacturer |

The effective system data available from the data sheet would therefore have to be converted by the user or via a program. For example, a different noise level is superposed on the measurements, if a different measurement bandwidth is used. The noise level, which corresponds to the data from Table 4 and the noise level of the current device setting, are calculated from the equivalent noise bandwidth $B_{IF}$ and the noise dimension NF.

$$L_R = -174 \text{ dB} + NF + 10 lg(S_F) \text{dB} + 10 lg\left(\frac{B_{IF}}{\text{Hz}}\right) \text{dB} \quad (1\text{-}11)$$

The formulae (1-4) to (1-10) can be combined to give a formula, which describes the relationship of the measured values $M_O$, $M_S$, $M_M$ obtained from the calibration and the characteristic data of the standards $\Gamma_O$, $\Gamma_S$, $\Gamma_M$ and the measured value M and the value $\Gamma_{DUT}$. The partial derivations according to $M_O$, $M_S$, $M_M$, $\Gamma_O$, $\Gamma_S$ and $\Gamma_M$ can be calculated from this formula. These derivations represent the sensitivity quotients $c_m$, with which the measured-value deviations in the case of the standard measurement $\Delta M_O$, $\Delta M_S$, $\Delta M_M$ or respectively the uncertainties of the characteristic data enter into the effective system data. A modified uncertainty of the effective system data is calculated from this:

$$u_{eff} = \sqrt{\begin{array}{l}|c_{MM}\Delta M_M|^2 + |c_{MS}\Delta M_S|^2 + |c_{MO}\Delta M_O|^2 + \\ |c_{\Gamma M}\Delta \Gamma_M|^2 + |c_{\Gamma S}\Delta \Gamma_S|^2 + |c_{\Gamma O}\Delta \Gamma_O|^2\end{array}} \quad (1\text{-}12)$$

Conversely, the systematic measured-value deviation of the calibrated network analyser can be calculated from nominal values of the effective system data. A similar error model to that shown in FIG. 3 forms the basis of this calculation. It is presented in FIG. 4.

The error two-port of the effective data presented in FIG. 4 is described in principle by formula (1-10). In this formula, only the error terms $e_{00}$, $e_{10}$ and $e_{11}$ must be substituted by the relevant, effective system data $e_{00eff}$, $e_{01eff}$ and $e_{11eff}$. The reflection factor $S_{11M}$ displayed on the calibrated measuring device is used instead of the measured value $M_{DUT}$.

$$S_{11} = \frac{S_{11M} - e_{00eff}}{e_{10eff} + e_{11eff}(S_{11M} - e_{00eff})} \quad (1\text{-}13)$$

In order to calculate the sensitivity coefficients, in a similar manner to that described in the preceding section, the partial derivatives from formula (1-13) must be determined according to $e_{00eff}$, $e_{01eff}$ and $e_{11eff}$ at the point $e_{00eff}=0$ $e_{01eff}=1$ and $e_{11eff}=0$ $$\frac{\partial S_{11}}{\partial e_{00eff}} = \frac{-e_{10eff}}{\left[\frac{e_{10eff} + e_{11eff}}{(S_{11M} - e_{00eff})}\right]^2} e_{00eff} = 0; \overrightarrow{e_{10eff} = 1}; e_{11eff} = 0 - 1 \quad (1\text{-}14)$$

$$\frac{\partial S_{11}}{\partial e_{10eff}} = \frac{-(S_{11M} - e_{00eff})}{\left[\frac{e_{10eff} + e_{11eff}}{(S_{11M} - e_{00eff})}\right]^2} e_{00eff} = 0; \overrightarrow{e_{10eff} = 1}; e_{11eff} = 0 - S_{11M} \quad (1\text{-}15)$$

$$\frac{\partial S_{11}}{\partial e_{11eff}} = \frac{-(S_{11M} - e_{00eff})}{\left[\frac{e_{10eff} + e_{11eff}}{(S_{11M} - e_{00eff})}\right]^2} e_{00eff} = 0; \overrightarrow{e_{10eff} = 1}; e_{11eff} = 0 - S_{11M}^2 \quad (1\text{-}16)$$

Only the moduli of the partial derivations are relevant for the further computation. Accordingly, the systematic measurement uncertainties have been dealt with in full. Statistical measurement uncertainties can be subdivided into various influencing factors. With regard to the noise, a distinction is made between high-level noise $N_1$ and low-level noise $N_2$. The nonlinearity of the analyser, which is described in a first approximation by the parameter A, is added to this. The parameters $N_1$, $N_2$ and A are dependent upon the device type and the device settings (IF-bandwidth, test-port output level, average factor, . . . ).

$$N=|N_1||s_{11M}|+|N_2|+|A||s_{11M}| \quad (1\text{-}17)$$

The effective system data provide a drift. In the present case, the repeatability of the plug-and-socket connection can be included in the calculation of this drift. The corresponding sensitivity coefficients are derived from the formulae (1-14) to (1-16).

$$\Delta=|\Delta_{e00\mathit{eff}}|+|\Delta_{e10\mathit{eff}}||s_{11M}|+|\Delta_{e11\mathit{eff}}||s_{11M}|^2 \quad (1\text{-}18)$$

From the statistical measurement uncertainties $u_{\mathit{eff}}$, N and Δ, optionally with other contributions not listed here, and the systematic components:

$$|s_{11}|=|s_{11M}|+|e_{00\mathit{eff}}|+|e_{10\mathit{eff}}||s_{11M}|+|e_{11\mathit{eff}}||s_{11M}|^2 \quad (1\text{-}19)$$

a corresponding total uncertainty is calculated:

$$u_c = \sqrt{\sum_{m=1}^{M} (u_m c_m)^2}, \quad (1\text{-}20)$$

wherein the following table illustrates the allocation of the parameters $u_m$ and $c_m$.

TABLE 5

Parameters for formulae (1-20)

| Parameter $u_m$ | Sensitivity coefficient $c_i$ | Comment |
|---|---|---|
| $u_{\mathit{eff}}$ | | See formula (1-12) |
| $|e_{00\mathit{eff}}|$ | 1 | Modulus of the effective directivity |
| $|e_{10\mathit{eff}}|$ | $|S_{11M}|$ | Modulus of the effective reflection synchronism |
| $|e_{11\mathit{eff}}|$ | $|S_{11M}|^2$ | Modulus of the effective source port matching |
| $|A|$ | $|S_{11M}|$ | Modulus of the display linearity of the reflection |
| $|N_1|$ | $|S_{11M}|$ | Modulus of the effective high-level noise |
| $|N_2|$ | 1 | Modulus of the effective low-level noise |
| $|\Delta_{e00\mathit{eff}}|$ | 1 | Modulus of the drift of the effective directivity |
| $|\Delta_{e10\mathit{eff}}|$ | $|S_{11M}|$ | Modulus of the drift of the effective reflection synchronism |
| $|\Delta_{e01\mathit{eff}}|$ | $|S_{11M}|^2$ | Modulus of the drift of the effective source-port matching |

The total measurement uncertainty obtained for the modulus of the scattering parameter $S_{11}$ can be expressed by formula 1-21.

Overall formula for the measurement uncertainty of the reflection measurement with symbol table:

Table of Symbols $|s_{11}| = |S_{11M}| + |e_{00\mathit{eff}}| + |e_{10\mathit{eff}}||s_{11M}| + |e_{11\mathit{eff}}||s_{11M}|^2$ (systematic)

$\quad\quad\; + |N_1||s_{11M}| + |N_2|$ (noise) (1-21)

$\quad\quad\; + |A||s_{11M}|$ (linearity) (3.5-26)

$\quad\quad\; + |\Delta_{e00\mathit{eff}}| + |\Delta_{e10\mathit{eff}}||s_{11M}| + |\Delta_{e11\mathit{eff}}||s_{11M}|^2$ (drift)

| Symbol | Parameter |
|---|---|
| $|s_{11}|$ | Modulus of the reflection factor (measurement parameter) |
| $|s_{11M}|$ | Modulus of the reflection factor displayed on measuring instrument |
| $|e_{00\mathit{eff}}|$ | Modulus of the effective directivity |
| $|e_{10\mathit{eff}}|$ | Modulus of the effective reflection synchronism |
| $|e_{11\mathit{eff}}|$ | Modulus of the effective source-port matching |
| $|A|$ | Modulus of the display linearity of the reflection |
| $|N_1|$ | Modulus of the effective high-level noise |
| $|N_2|$ | Modulus of the effective low-level noise |
| $|\Delta_{e00\mathit{eff}}|$ | Modulus of the drift of the effective directivity |
| $|\Delta_{e10\mathit{eff}}|$ | Modulus of the drift of the effective reflection synchronism |
| $|\Delta_{e11\mathit{eff}}|$ | Modulus of the drift of the effective source-port matching |

Figure 7:
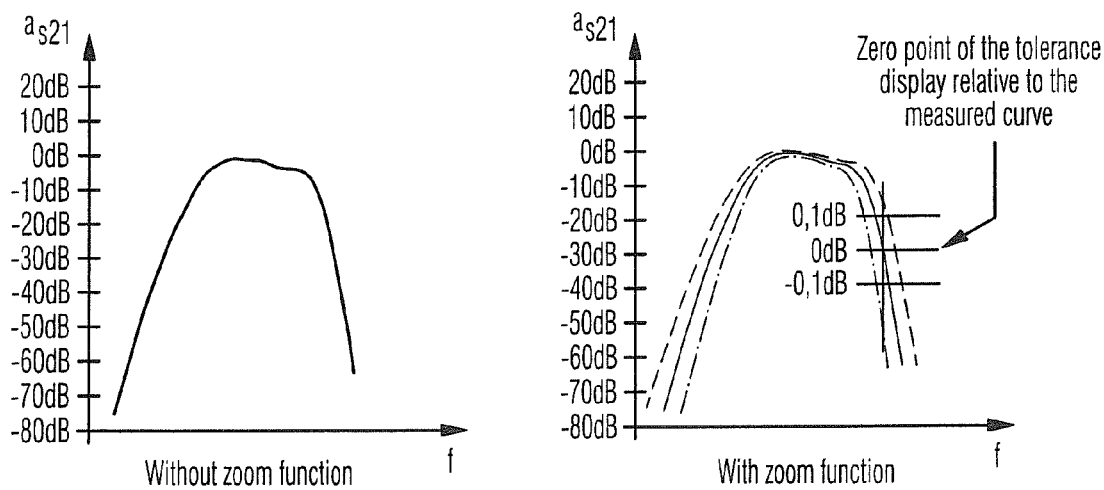
FIG. 7 shows an intelligent zoom function.
Figure 6:
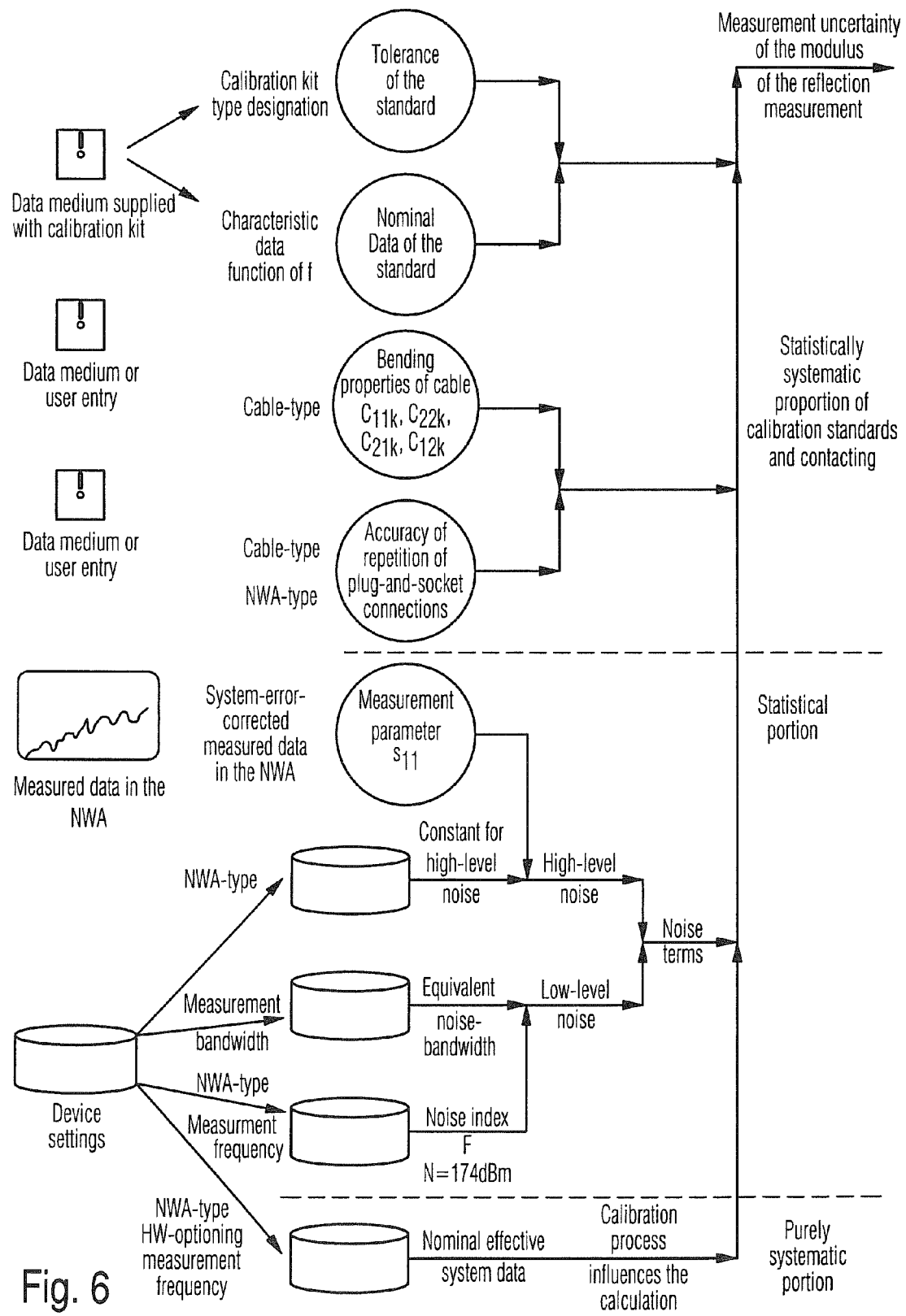
FIG. 6 shows influencing parameters for the uncertainty computation with the example of the modulus of the reflection factor and its origin.

The modulus of the S-parameter resulting for the maximal and minimal measurement uncertainty, which can therefore be maximally larger than or maximally smaller than the measured value $S_{11M}$, can be calculated according to this formula in the internal computer of the network analyser with the effective system data stored there in corresponding databanks, taking into consideration the values N ($N_2$, for example, is dependent upon the measurement bandwidth) obtained from the device setting and the drift of these effective system data, resulting from the formula 1-18. The maximal or minimal possible measured value calculated in this manner for the modulus $S_{11}$ is presented as a continuous symmetrical tolerance zone, as illustrated in FIG. 7, for all of the measured points displayed alongside one another in the overall curve of the S-parameter.

The effective system data, on the basis of which this computation of the measurement uncertainty is implemented, are determined, for example, using a known verification method in the manufacturer's test laboratory and stored directly in a databank of the internal computer in the network analyser. This monitoring of a calibrated network analyser by means of appropriate verification standards (high-precision devices under test) is implemented, for example, according to the verification method, as described in the documents DE 10 2004 047 308 A1 and respectively DE 102 11 334 A1. The effective system data required for a transmission measurement can also be determined according to these methods and then used in a similar manner to calculate the measurement uncertainty. Verification measurements of this kind can be implemented in a manner similar to an automatic calibration without user intervention. The maximum accuracy is achieved with a method according to DE 102 11 334 A1. This method can also be expanded for transmission measurements by the inclusion of an overhead line.

The user of the network analyser can also determine these effective system data directly by implementing the respective measurements with appropriate verification standards on the calibrated network analyser, deriving the effective system data from these measurements and entering the data into the internal computer. In this case, the term according to formula 1-12 is not required in the tolerance calculation; otherwise, the computation of the measurement uncertainty is implemented with the effective system data obtained directly by the user as described above. The accuracy of the verification standards is taken into consideration accordingly in the calculation, for example, by appropriate supplements.

The device settings, such as the average factor, the IM bandwidth (and the effective noise bandwidth determined from the latter by means of a databank), the measurement frequency, the output level and respectively the measured value, are directly accessible to the computation software without user interaction for the realisation according to the invention. Further influencing parameters, which have not been described in greater detail with reference to formula (1-20) for reasons of simplicity, are as follows:
  the bending behaviour of the test cables, which is described by the S-parameters $S_{11k}$, $S_{12k}$, $S_{21k}$, $S_{22k}$;
  the properties of additional adapters $S_{11A}$, $S_{12A}$, $S_{21A}$, $S_{22A}$; introduced after the calibration;
  the quality (for example, difference SMA/PC 3.5) of the plug-and-socket connections on the device under test;
  elements with attenuation used in the test setup.

These influencing parameters can be made accessible to the computation software on the network analyser most conveniently via a data medium (supplied with the relevant test accessories). A user dialogue, in which the corresponding type of accessory is selected, is also possible as an alternative. As shown in the flow chart in FIG. 6, databanks especially prepared for the measurement uncertainty are provided in the network analyser. The databanks are used for converting the test parameters into the corresponding parameters for computation of the measurement uncertainty. The conversion of the IF bandwidth into the equivalent noise bandwidth can be mentioned as an example.

The conversion of the effective system data to other device settings has been modelled here by means of the uncertainty contribution $u_{eff}$. The accuracy of this conversion is subject to technical limits. This problem can be bypassed, on the one hand, by restricting the selectable measurement parameters, for example, in the case of measurements with activated tolerance analysis, the selection of the IF bandwidth only within the range from 10 Hz to 1 kHz. The other possibility would be to store the effective system data in the databank of the network analyser dependent upon various settings.

Formula (1-20) is therefore evaluated according to the device settings. However, this formula provides only the measurement uncertainty for the modulus of the reflection factor. For the phase uncertainty of this test parameter, calculations similar to those presented in formulae (1-1) to (1-20) must be implemented. In the case of transmission measurements, these calculations must be expanded, for example, with the behaviour of the passive test ports (load-port matching to the measured transmission coefficients). With regard to transmission coefficients, corresponding measurement-uncertainty calculations according to modulus and phase are also necessary in order to generate the tolerance bar chart for the transmission coefficients $S_{21}$, $S_{12}$, . . . .

Figure 5:
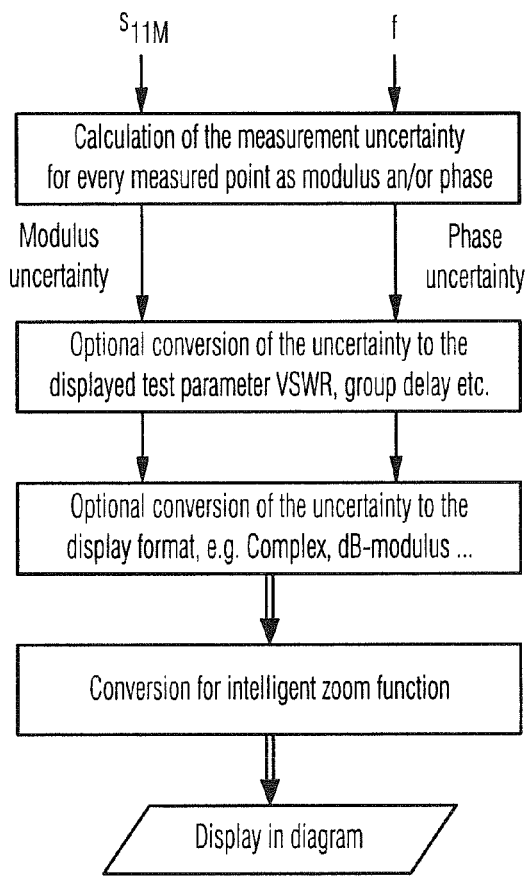
FIG. 5 shows processing stages for displaying the measurement-uncertainty.

The measured value, for example, $S_{11M}$ and the frequency value (→databank supplies effective system data) are used as parameters for calculating the associated measurement uncertainty individually for every measured value (FIG. 5). The uncertainty computation itself is visualised in FIG. 6 with the example of the modulus of the reflection factor of a one-port device under test. The measurement uncertainty can be converted as required for derived test parameters (for example, VSWR, group delay time, impedance . . . ). This is followed by conversion to the corresponding display format (dB modulus display, linear modulus display, complex display). Before presentation as a curve, the tolerances should be converted in order to allow an intelligent zoom function. FIG. 7 illustrates interpretation of the intelligent zoom function.

In view of the different orders of magnitude of the display scales for the measured value and the tolerance (display scale, for example −80 dB to 20 dB and tolerance display, for example 0.1 dB), the tolerance zone is not visible in the left-hand display of the measured curve. Through the use of the intelligent zoom function, the tolerance zone around the measurement curve is presented with a different scale, for example, enlarged by a factor of 100, as illustrated on the right-hand side in FIG. 7.

Figure 8:
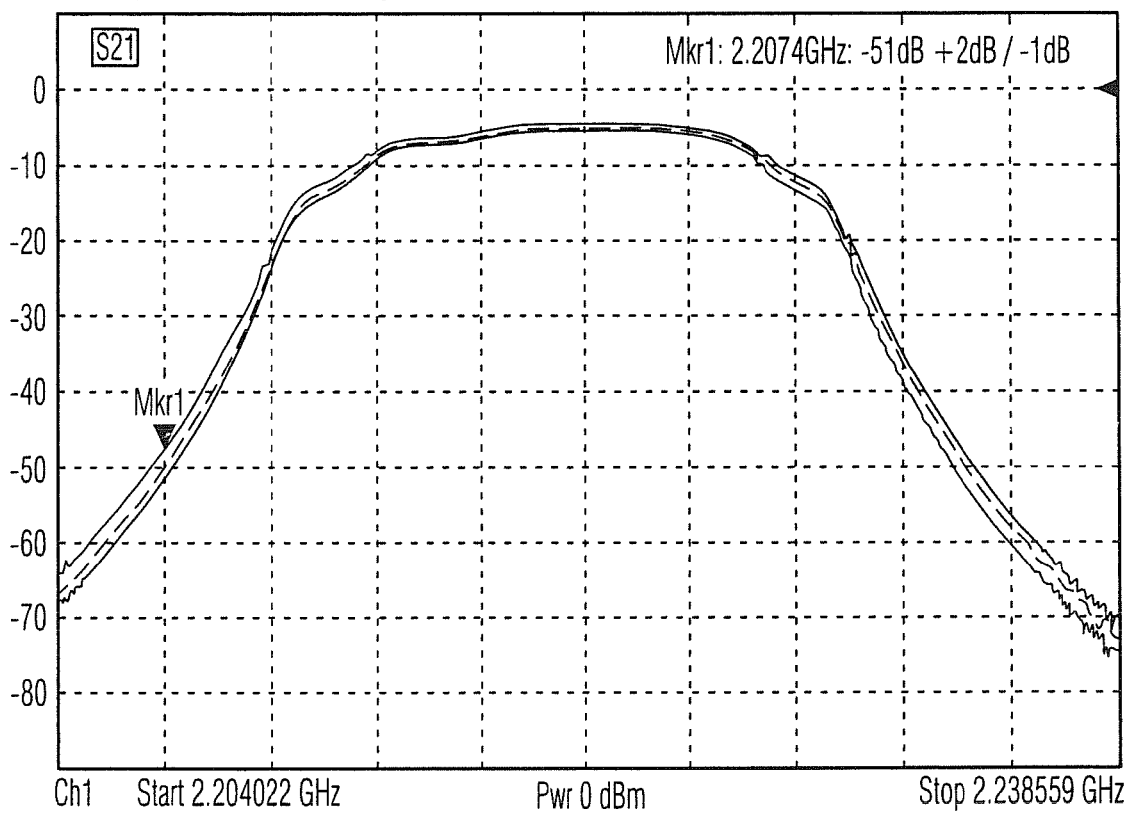
FIG. 8 shows an example of the display.

One further possibility is to show additional measurement-uncertainty markers, which can be placed freely along the measurement curve in a similar manner to conventional markers. FIG. 8 shows an example. The relevant measurement uncertainty is displayed digitally alongside the measured value at the appropriate scale in the associated marker information field. In the case of a dB scaling, an asymmetric tolerance zone will generally occur, for which reason, the marker-information field, which is presented here in the upper right-hand portion of the display field, provides a separate upper and lower limit.

Section 2:

Tolerance analysis for non-linear measurements.

In non-linear measurements, the behaviour of the device under test is dependent upon the connected level. The accuracy of the output level can be optimised using appropriate measures, such as the generator-level calibration. The measurement-uncertainty analysis includes an analysis according to Section 1 and 2 (if S-parameters are presented). For wave parameters, the error analysis described further below is additionally required.

The accuracy of the level used in the measurement is crucially dependent upon the power meter used for the level calibration. Since, alongside the HF connection, the power meter is also already connected via a data connection for transmission of the measured values to the network analyser for the level calibration, the technical data of the power meter or respectively its type can also be transmitted in this context. If only its type is transmitted, the network analyser uses an internal databank to obtain the required accuracy data for the power meter. Further influencing parameters occur, for example, as a result of using an amended level for the measurement (generator linearity) or switching over a calibration line. The number of test cycles in the level calibration is also relevant. A total uncertainty for the output level (that is to say, the wave parameters $a_1, a_2, a_3 \ldots$) can be indicated from these and other influencing parameters in a manner similar to that described in Section 1. Alongside these wave parameters, it is, however, primarily the output parameters of the device under test, for example, $b_1, b_2 \ldots$, which are relevant.

The measurement of nonlinear devices under test (S-parameters, wave parameters, wave-parameter ratios, harmonics, ...) requires a tolerance analysis, which also takes into consideration the nonlinear properties of the device under test. A general tolerance analysis according to FIG. 1 is therefore no longer possible. However, a quasi-general tolerance analysis, for which the typical nonlinear properties of the device under test must be parameterised, might also be possible. These properties can also provide scattering, for which reason, an individual worst-case model would have to be prepared dependent upon the properties of the device under test. The amount of work and specialist understanding required from the user are correspondingly increased.

A further object of the invention is to provide a tolerance analysis, which does not require unnecessary user entries or models, directly in the measuring device and, in this case also, in the least complicated manner possible. The corresponding method is introduced as an in-vivo tolerance analysis method. In this context, the software used for the measurement-uncertainty analysis must be capable of influencing the measurement accordingly in order to determine the dynamic influence of stimulus fluctuations (for example, fluctuations in the parameters $a_1, a_2 \ldots$) in the "live device under test".

This method will be illustrated with the example of a transmission measurement. The actual value a1 is determined from the level uncertainty of the network analyser. This can be improved via the level calibration. However, a residual uncertainty with regard to the level applied to the device under test still remains. The device under test is excited successively with three different levels. The nominal level $a_1$, the nominal level $a_1 - \Delta_{min}$ reduced by the lower uncertainty threshold and the nominal level $a_1 + \Delta_{max}$ increased by the upper uncertainty threshold. The three corresponding output levels $b_2, b_{2min}, b_{2max}$ are obtained at the output of the device under test. These values are then included in the further receiver-end tolerance calculation.

Accordingly, the dynamic tolerance analysis does not require the worst-case model referred to above. The method presupposes the direct tolerance display on the measurement curve. It is therefore sufficient to use the tolerance values derived for the current device under test from its in-vivo behaviour. As a result, a model for an entire series of devices under test is superfluous. The yield is higher because an individual, automatic DUT model is used for every measurement, and no worst-case assumptions of the device-under-test model enter the computation.

Figure 9:
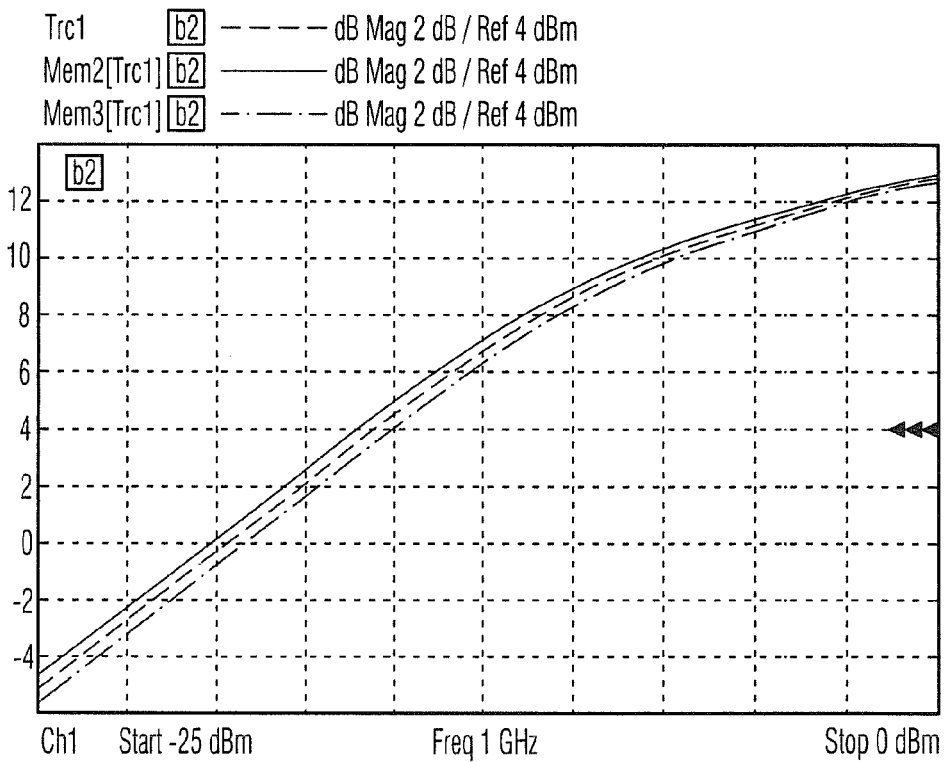
FIG. 9 shows the measurement uncertainty of the b2 wave in the case of a level sweep.

FIG. 9 shows an example for the $b_2$ measurement in the case of an amplifier. This measurement provides the additional factor, that the input power is plotted as the x-axis instead of the frequency (level sweep). The tolerance of the level $a_1$ has been selected here at +/−0.5 dB.

Figure 10:
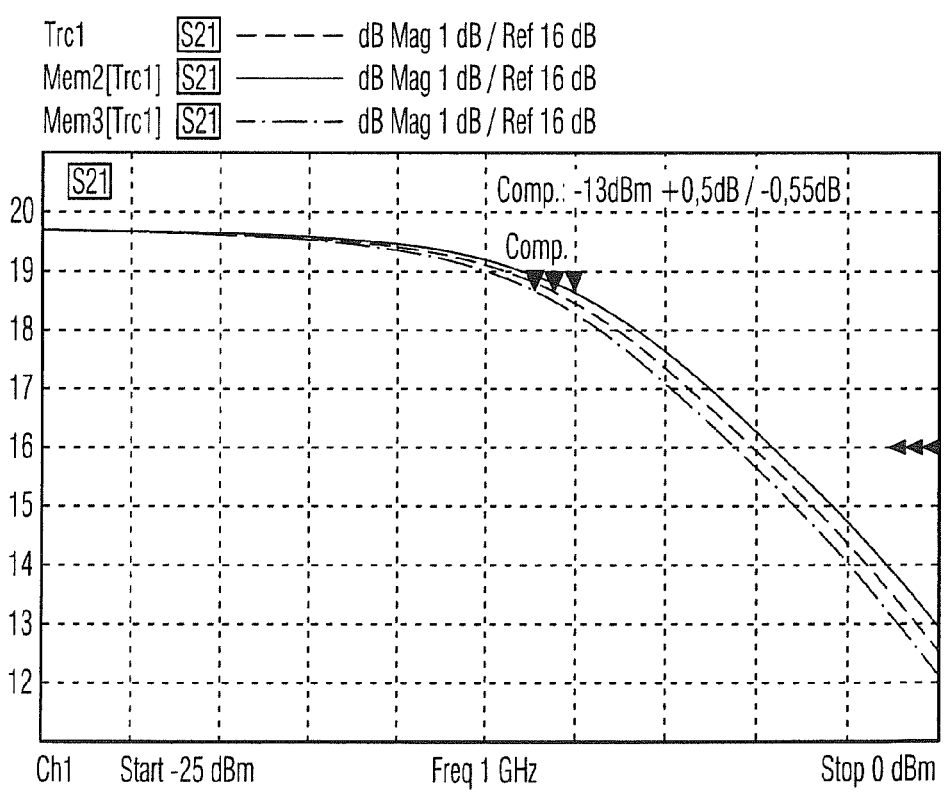
FIG. 10 shows the measurement uncertainty of the parameter $S_{21}$ in the case of a level sweep.

FIG. 10 shows an example of a compression-point measurement with error analysis. The methods from Section 1 and Section 2 as well as Section 3 are combined. The measured result is determined as the S-parameter $S_{21}$ using system-error correction and level calibration.

The extended measurement uncertainty is conventionally indicated by k=2. That is the interval, within which approximately 95% of the measured values are disposed. The interval, in which, for example, 68% of the measured values are disposed, is obtained with k=1. The display of the tolerance zone can also take place in an amorphous manner. That is to say, the point density, with which the zone is presented, is a measure for the frequency of the corresponding value. A false-colour presentation can also be used instead of the point density.

The tolerance analysis can also be provided for other wobble operating modes. For example, alongside the tolerance analysis in conjunction with the level sweep, as already mentioned, a tolerance analysis in a time-sweep/CW mode is also possible.

A continuously-updated tolerance list for the accessories, which can establish the association between an accessory type and its tolerance features, can be stored on the network analyser and updated, for example, within the framework of a firmware update process. Since almost all modern network analysers provide a LAN connection, it would also be possible to offer a tolerance list, which the analyser uses autonomously and which is serviced via the Internet by several manufacturers. In this context, the databanks provided locally in the measuring device could be updated in a routine manner. The tolerance properties for new calibration kits, power meters and test cables would therefore be available independently of the distribution cycle of new firmware versions.

The measurement uncertainty of test systems is becoming increasingly important as a result of the increasingly-compact structure and miniaturisation of components. In future, more-complex mathematical models will be required, which can include in the calculation, for example, a temperature drift from the current temperature. Furthermore, measurement-uncertainty analyses, which are tailor made for special applications, are demanded by the market. In this context, the fields of material measurement, antenna measurement and back-scattering measurement can be mentioned as examples. Another application is measurement-accuracy analysis in the context of time-domain calculations. Calculations for measurement uncertainty are also required for active components, especially for stability factors. In future, a computation of tolerance analysis for trace mathematics could also be provided for further calculation. For example, consequential errors could also be taken into consideration.

The invention is not restricted to the exemplary embodiments described. All of the features described and/or illustrated in the drawings can be combined with one another as required within the framework of the invention.

The invention claimed is:

1. A method for determining measurement uncertainty of measured values of a network analyser having a nonlinearity, comprising:
    calculating, for every measured value of a respectively-selected measurement type, the measurement uncertainty in an internal computer of the network analyser according to modulus and/or phase;

displaying the calculated measurement uncertainty together with the respective measured value, storing in databanks allocated to the internal computer data required for calculating the measurement uncertainty, said data resulting directly from properties and an operating mode of the network analyzer and directly accessible to the internal computer, and entering externally into the databanks only data from additionally-used measurement resources, which differ from the data already stored in the databanks, where they are set off against the originally-stored data and included as new data in the calculation of the measurement uncertainty;

wherein the method for the measurement-uncertainty analysis influences the measurement of non-linear devices in order to determine the dynamic influence of stimulus fluctuations in a device under test, wherein external measurement-resource data, which are to be entered additionally for the various, most-current measurement resources, are listed in a databank of the network analyser, from which they can be selected according to a frequency range for superposing statistical measurement uncertainties on the calculated measurement uncertainty; and wherein the nonlinearity of the analyser is added to the statistical measurement uncertainties.

2. The method according to claim 1 for the measurement type "presentation of scattering parameters", wherein data corresponding to the respective type of the network analyser and its options; data corresponding to respectively-selected device settings such as measurement frequency, measurement bandwidth, average factor, generator level; characteristic data including error tolerances of calibration standards used by the manufacturer, test cables and test plug and socket connections; and effective system data determined by the manufacturer are all stored in the databanks of the network analyser allocated to the internal computer, and wherein only data from calibration standards used optionally by the user for calibration of the network analyser and from test cable and test plug and socket connections, which differ from the measurement resources used by the manufacturer, are entered externally into the internal databanks, set off against the original data and included accordingly in the computation of the measurement uncertainty for every measured value.

3. The method according to claim 2, wherein additional, external data regarding bending behaviour of the test cables, the properties of additional adapters optionally introduced after the calibration and quality of the plug and socket connections in the device under test or respectively of any attenuation elements used in the test setup are entered into the databanks and included accordingly in the computation of the measurement uncertainty.

4. The method according to claim 3, wherein external measurement-resource data, which are to be entered additionally, are entered into the databanks of the internal computer via a data medium associated with the respective measurement resource.

5. The method according to claim 2, wherein external measurement-resource data, which are to be entered additionally, are entered into the databanks of the internal computer via a data medium associated with the respective measurement resource.

6. The method according to claim 2, wherein external measurement-resource data, which are to be entered additionally for the various, most-current measurement resources, are listed in a databank of the network analyser, from which they can be selected.

7. The method according to claim 1, wherein external measurement-resource data, which are to be entered additionally, are entered into the databanks of the internal computer via a data medium associated with the respective measurement resource.

8. The method according to claim 1, wherein effective system data are stored in the databanks dependent upon various possible settings of the network analyser.

9. The method according to claim 1, wherein, before being displayed, the measurement uncertainty calculated according to modulus and/or phase for a given measurement value is converted into another measurement value derived from the latter and then displayed together with this derived measurement value.

10. The method according to claim 9, wherein, before being displayed, the measurement uncertainty calculated according to modulus and/or phase for a reflection factor is converted into a voltage standing wave ratio (VSWR), a group delay time, or an impedance measurement value derived from the reflection factor and then displayed together with this derived measurement value.

11. The method according to claim 1, wherein the measurement uncertainty calculated according to modulus and/or phase for one display format is converted and presented in another display format.

12. The method according to claim 11, wherein the measurement uncertainty calculated according to modulus and/or phase for a linear display format is converted and presented in a dB or logarithmic display format.

13. The method according to claim 1, wherein the measurement uncertainty calculated for the individual measured values is presented graphically on the display device of the network analyser together with the measurement curve as a tolerance zone.

14. The method according to claim 13, wherein the tolerance zone around the measurement curve is displayed in another scale.

15. The method according to claim 14, wherein the tolerance zone around the measurement curve is displayed in an enlarged scale.

16. The method according to claim 13, wherein the tolerance zone is presented graphically in a different manner corresponding to the frequency of occurrence of the measured values.

17. The method according to claim 1, wherein portions of the measurement curve can be selected by using markers, which can be displaced along the measurement curve, wherein the associated measurement-uncertainty values are then displayed separately.

18. The method according to claim 17, wherein the associated measurement-uncertainty values are displayed in a digital manner.

19. The method according to claim 1, wherein, using data entered into the network analyser with regard to the power meter used for the level calibration, the measurement uncertainty is calculated within the internal computer of the network analyser for every measured value according to modulus and/or phase and displayed together with the respective measured value.

* * * * *